(12) United States Patent
Jang et al.

(10) Patent No.: US 9,826,668 B2
(45) Date of Patent: Nov. 21, 2017

(54) COMPOSITE SHEET AND PORTABLE TERMINAL HAVING SAME

(71) Applicant: AMOGREENTECH CO., LTD., Gimpo-si (KR)

(72) Inventors: Kil Jae Jang, Seongnam-si (KR); Dong Hoon Lee, Yongin-si (KR); Seung Jae Hwang, Incheon (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 0 days.

(21) Appl. No.: 15/101,631

(22) PCT Filed: Dec. 31, 2014

(86) PCT No.: PCT/KR2014/013129
§ 371 (c)(1),
(2) Date: Jun. 3, 2016

(87) PCT Pub. No.: WO2015/102415
PCT Pub. Date: Jul. 9, 2015

(65) Prior Publication Data
US 2017/0034959 A1    Feb. 2, 2017

(30) Foreign Application Priority Data

Dec. 31, 2013 (KR) .......... 10-2013-0168278
Dec. 31, 2013 (KR) .......... 10-2013-0168279
Dec. 31, 2013 (KR) .......... 10-2013-0168280

(51) Int. Cl.
*H05K 7/20* (2006.01)
*H04M 1/02* (2006.01)
(Continued)

(52) U.S. Cl.
CPC ......... *H05K 7/20963* (2013.01); *B32B 5/022* (2013.01); *B32B 7/12* (2013.01);
(Continued)

(58) Field of Classification Search
CPC . G06F 1/181–1/182; H05K 7/20218–7/20381;
(Continued)

(56) References Cited

U.S. PATENT DOCUMENTS 6,109,343 A * 8/2000 Langley ............... H01L 23/367
165/104.23
6,400,571 B1 * 6/2002 Kimura ..................... G06F 1/18
165/185
(Continued)

FOREIGN PATENT DOCUMENTS

JP    10229287    8/1998
KR    20080076761    8/2008
(Continued)

OTHER PUBLICATIONS

International Search Report—PCT/KR2014/013129 dated Mar. 27, 2015.

*Primary Examiner* — Anthony Haughton
*Assistant Examiner* — Razmeen Gafur
(74) *Attorney, Agent, or Firm* — Cantor Colburn LLP

(57) ABSTRACT

Provided are a composite sheet and a mobile terminal having the same, in which the composite sheet includes: a first heat insulation member having a plurality of fine pores to form air pockets for thermal insulation; and a second insulation member which is laminated on the first insulation member, and which facilitates a horizontal direction transfer of heat conducted hut suppresses a vertical direction transfer thereof.

17 Claims, 7 Drawing Sheets

(51) Int. Cl.
*G06F 1/20* (2006.01)
*H01F 1/153* (2006.01)
*H01F 1/16* (2006.01)
*B32B 5/02* (2006.01)
*B32B 7/12* (2006.01)
*B32B 15/14* (2006.01)
*F16L 59/02* (2006.01)
*F16L 59/06* (2006.01)
*F16L 59/10* (2006.01)
*H05K 5/00* (2006.01)
*H05K 5/03* (2006.01)
*B32B 15/08* (2006.01)
*B32B 15/18* (2006.01)
*B32B 15/20* (2006.01)
*H01L 23/473* (2006.01)

(52) U.S. Cl.
CPC ............. *B32B 15/08* (2013.01); *B32B 15/14* (2013.01); *B32B 15/18* (2013.01); *B32B 15/20* (2013.01); *F16L 59/028* (2013.01); *F16L 59/06* (2013.01); *F16L 59/10* (2013.01); *G06F 1/203* (2013.01); *H01F 1/153* (2013.01); *H01F 1/16* (2013.01); *H04M 1/02* (2013.01); *H04M 1/0202* (2013.01); *H04M 1/0266* (2013.01); *H05K 5/0017* (2013.01); *H05K 5/03* (2013.01); *H05K 7/20436* (2013.01); *B32B 2262/0261* (2013.01); *B32B 2262/0276* (2013.01); *B32B 2307/302* (2013.01); *B32B 2307/304* (2013.01); *B32B 2307/306* (2013.01); *B32B 2307/702* (2013.01); *B32B 2307/704* (2013.01); *B32B 2405/00* (2013.01); *B32B 2457/20* (2013.01)

(58) Field of Classification Search
CPC .................. H05K 7/20409–7/20418; H05K 7/20009–7/202; H01L 23/46–23/3677
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 7,206,202 B2* | 4/2007 | Yang | H01L 23/467 165/80.2 |
| 7,369,409 B2* | 5/2008 | Yazawa | H01L 23/34 165/80.4 |
| 7,375,966 B2* | 5/2008 | Murakami | B60R 16/0239 257/706 |
| 2003/0043541 A1* | 3/2003 | Yuasa | A01N 25/10 361/679.54 |
| 2005/0259403 A1* | 11/2005 | Sonoda | H02M 3/00 361/719 |
| 2007/0127210 A1* | 6/2007 | Mahalingam | G06F 1/20 361/700 |
| 2008/0035907 A1* | 2/2008 | Czubatyj | H01L 45/085 257/4 |
| 2008/0241455 A1* | 10/2008 | DiNello | B32B 3/26 428/58 |
| 2009/0050294 A1* | 2/2009 | Fedorov | G06F 1/20 165/80.3 |
| 2009/0065055 A1* | 3/2009 | Fujii | B32B 27/20 136/259 |
| 2009/0086435 A1* | 4/2009 | Suzuki | H01L 23/3735 361/704 |
| 2009/0190312 A1* | 7/2009 | Katayama | H01L 21/268 361/708 |
| 2010/0008036 A1* | 1/2010 | Risher-Kelly | G06F 1/1632 361/679.47 |
| 2010/0134942 A1* | 6/2010 | Wang | H01C 1/1406 361/93.7 |
| 2010/0207055 A1* | 8/2010 | Ueno | C22C 32/0084 252/71 |
| 2011/0128706 A1* | 6/2011 | Tsunoda | G06F 1/203 361/704 |
| 2011/0139706 A1* | 6/2011 | Kalayci | B01D 39/1623 210/490 |
| 2011/0149521 A1* | 6/2011 | Leu | C22C 1/02 361/719 |
| 2011/0309222 A1* | 12/2011 | Hynell | G06F 1/203 248/346.02 |
| 2012/0052351 A1* | 3/2012 | Yeh | H01M 10/052 429/94 |
| 2012/0282429 A1* | 11/2012 | DiNello | B29C 41/18 428/71 |
| 2012/0287571 A1* | 11/2012 | Santos | G06F 1/206 361/679.48 |
| 2012/0315225 A1* | 12/2012 | Porbeni | A61L 15/26 424/49 |
| 2012/0315319 A1* | 12/2012 | Kasuga | A61L 31/06 424/443 |
| 2012/0318731 A1* | 12/2012 | Elbahri | B01D 67/0006 210/500.25 |
| 2013/0077233 A1* | 3/2013 | Cao | H01L 23/36 361/679.54 |
| 2013/0301221 A1* | 11/2013 | Wu | H01L 23/38 361/707 |
| 2014/0299360 A1* | 10/2014 | Yoshida | H05K 1/09 174/251 |

FOREIGN PATENT DOCUMENTS

| | | |
|---|---|---|
| KR | 101134880 | 4/2012 |
| KR | 101161735 | 7/2012 |
| KR | 101179364 | 9/2012 |
| KR | 20120125365 | 11/2012 |

* cited by examiner

COMPOSITE SHEET AND PORTABLE TERMINAL HAVING SAME

TECHNICAL FIELD

The present invention relates to a composite sheet, and more particularly to, a composite sheet which can suppress transfer of heat with a single sheet to thus maximize the heat transfer suppression efficiency, and which can be configured into an ultrathin sheet, and a mobile terminal having the same.

BACKGROUND ART

Generally, if electronic products such as computers, displays, and mobile terminals do not adequately diffuse heat generated from the inside of the electronic products to the outside thereof, a collision with the residual images on a screen, the failure of the system, etc., may be caused due to excessive accumulation of the heat generated. In addition, due to the excessive accumulation of the heat, the life of the electronic products may be shortened or the source of the explosion and fire may be also provided in severe cases.

In recent years, electronic products including mobile terminals are continuously evolving, and are promoting high performance and multi-function according to user's needs.

In particular, mobile terminals are required to be compact in size and light in weight to maximize the user's portability and convenience, and integrated components are being mounted in a small space for the high-performance. Accordingly, components used in mobile terminals become increasingly high performance to thus increase heating temperature. The increased heating temperature makes an influence upon adjacent components to thus cause the performance of the mobile terminals to be lowered.

A variety of insulating materials are applied in mobile terminals in order to solve problems due to heat generated from the mobile terminals, but optimum insulation materials that are thin and has excellent heat insulation performance have not been developed yet. Thus, a technology of insulation is variously under research and development.

Korean Patent Registration Publication No. 10-1134880 disclosed a mobile terminal including a heat insulation film arranged in the front surface of a liquid crystal display (LCD) panel, showing an advantage of preventing the heat generated from the mobile terminal from being delivered to a user's face through the LCD panel. However, the heat insulation film is a low emissivity film that blocks passage of heat, while allowing transmission of visible light at maximum, and is attached on the front surface of the LCD panel, to thus cause a limit in insulating high temperature heat generated from built-in parts in a mobile terminal. As a result, a problem of heat generated from an up-to-date high performance mobile terminal may not be solved.

Thus, the present inventors have continuously studied a technology of suppressing a transfer of heat generated from a mobile terminal to thus have derived and invented structural features of a sheet that can perform heat radiation and heat transfer suppression function, and to thus have completed a composite sheet according to the present invention, which is more economical, utilizable, and competitive.

SUMMARY OF THE INVENTION

To solve the above problems or defects, it is an object of the present invention to provide a composite sheet of an ultra-thin laminated structure to thus maximize heat transfer suppression with a single sheet, and a portable terminal having the same.

It is another object of the present invention to provide a composite sheet provided with a heat spreader to thus disperse heat generated in a hot spot to thereby improve heat radiation efficiency, and a mobile terminal having the same.

To accomplish the above and other objects of the present invention, according to an aspect of the present invention, there is provided a composite sheet comprising: a first heat insulation member having a plurality of fine pores to form air pockets for thermal insulation; and a second heat insulation member which is laminated on the first heat insulation member, and which facilitates a horizontal direction transfer of heat conducted but suppresses a vertical direction transfer thereof.

In some embodiments, the second insulation member comprises a magnetic sheet having a ratio of a horizontal direction thermal conductivity with respect to a vertical direction thermal conductivity of 10:1 or more, and the second insulation member comprises a magnetic sheet having a specific resistivity of at least 100.

In some embodiments, the magnetic sheet is a Fe-based amorphous alloy or a Co-based amorphous alloy, and the Fe-based amorphous alloy is a Fe—Si—B alloy or Fe—Si—B—Cu—Nb alloy.

In some embodiments, the magnetic sheet is configured to include a plurality of fine pieces which are separated in a fine size and disposed adjacent, and an adhesive member which is attached on any one or either side of upper and lower portions of the magnetic sheet, in which gaps between the plurality of fine pieces are insulated in whole or in part.

In some embodiments, the gaps between the plurality of fine pieces are insulated by an adhesive agent provided in the adhesive member which is permeated into the gaps.

In some embodiments, the first heat insulation member is one of a nanofiber web, a nonwoven fabric, and a laminated structure of the nanofiber web and the nonwoven fabric, and the composite sheet further comprises a heat spreader which is interposed between the first insulation member and the second heat insulation member to thus disperse heat.

In some embodiments, the composite sheet further comprises a heat spreader which is laminated between the first insulation member and the second heat insulation member to thus disperse heat. In this case, the heat spreader is a metal thin plate of a thermal conductivity of 200 W/m·K or more, and the metal thin plate is made of Cu or Al.

To accomplish the above and other objects of the present invention, according to another aspect of the present invention, there is provided a composite sheet comprising: a heat spreader which disperses heat and radiates the heat; and a magnetic sheet which is laminated on the heat spreader and is configured to include a plurality of fine pieces which are separated in a fine size and disposed adjacent, and an adhesive member which is attached on any one or either side of upper and lower portions of the magnetic sheet, in which gaps between the plurality of fine pieces are insulated in whole or in part, to thus secondarily diffuse heat conducted from the heat spreader and suppress a vertical direction transfer of the heat.

In some embodiments, thickness of the magnetic sheet is 5 μm to 50 μm.

To accomplish the above and other objects of the present invention, according to still another aspect of the present invention, there is provided a mobile terminal comprising: a terminal main body; a removable rear cover on a rear surface of the terminal main body; a display unit which is exposed to the terminal main body; and a composite sheet adhered to an inner side of the rear cover or a rear surface of the display unit, wherein the composite sheet comprises: a heat spreader which disperses heat and radiates the heat; and a magnetic sheet which is laminated on the heat spreader and is configured to include a plurality of fine pieces which are separated in a fine size and disposed adjacent, and an adhesive member which is attached on any one or either side of upper and lower portions of the magnetic sheet, in which gaps between the plurality of fine pieces are insulated in whole or in part, to thus secondarily diffuse heat conducted from the heat spreader and suppress a vertical direction transfer of the heat.

As described above, according to the present invention, it is possible to implement a multifunctional ultra-thin sheet which can perform heat transfer suppression and heat radiation with a single sheet, to provide an advantage capable of reducing a manufacturing cost without using a separately individual sheet for heat transfer suppression and heat radiation.

The present invention has an effect of accomplishing an ultra-thin sheet having a thickness of several tens µm for heat transfer suppression and heat radiation by laminating a first heat insulation member, a heat spreader, and a second heat insulation member all of which are ultra-thin.

The present invention has an advantage of maximizing heat transfer suppression efficiency by suppressing heat transfer doubly in first and second heat insulation members.

The present invention may provide a technology capable of improving a heat transfer suppression performance with fine pores of a nano-size of a nanofiber web having a large heat blocking capability by applying the nanofiber web to a composite sheet, in which the nanofiber web is obtained by arranging electrospun nanofibers in a three-dimensional network structure.

The present invention has an effect capable of excellently performing heat transfer suppression and heat radiation with an ultra-thin sheet, to thus be applied to a high-performance electronic product including a mobile terminal.

DETAILED DESCRIPTION OF THE INVENTION

Figure 1:
FIG. 1 is a schematic cross-sectional view of a composite sheet according to an embodiment of the present invention.

Hereinafter, a composite sheet and a mobile terminal having the same according to embodiments of the present invention will be described with reference to the accompanying drawings. In the process, the sizes and shapes of components illustrated in the drawings may be shown exaggerated for convenience and clarity of explanation. Further, by considering the configuration and operation of the present invention, the specifically defined terms may be changed according to user's or operator's intention, or the custom. Definitions of these terms herein need to be made based on the contents across the whole application.

Referring to FIG. 1, a composite sheet according to a first embodiment of the present invention includes: a first heat insulation member 100 having a plurality of fine pores to form air pockets for thermal insulation; and a second insulation member 110 which is laminated on the first insulation member 100, and which facilitates a horizontal direction transfer of heat conducted but suppresses a vertical direction transfer thereof.

Here, the first heat insulation member 100 preferably employs a porous thin film having a plurality of pores capable of blocking heat like a nanofiber web.

The composite sheet according to the first embodiment of the present invention includes a first insulation member 100 and the second insulation member 110 to doubly inhibit the transfer of heat by conduction, to thus have an advantage of maximizing a heat transfer suppression capability with a single sheet.

In addition, the lamination in the present invention means that a layer and a sheet are laminated by a relationship such as bonding, adhesion, contact, and fixing. The composite sheet according to an embodiment of the present invention may be implemented into an ultra-thin sheet having a thickness of several tens µm by laminating a first heat insulation member 100 and a second heat insulation member 110 both of which are ultra-thin.

In some embodiments, the second insulation member 110 may include a magnetic sheet having a ratio of a horizontal direction thermal conductivity with respect to a vertical direction thermal conductivity of 10:1 or more, and the second insulation member may include a magnetic sheet having a specific resistivity of at least 100. In this case, the magnetic sheet is a Fe-based amorphous alloy or a Co-based amorphous alloy, and the Fe-based amorphous alloy is a Fe—Si—B alloy or Fe—Si—B—Cu—Nb alloy.

In addition, the magnetic sheet may be separated into a plurality of fine pieces or a bulk state (that is not separated into a plurality of fine pieces). Here, the magnetic sheet separated into a plurality of fine pieces is configured to include a plurality of fine pieces which are separated in a fine size and disposed adjacent, and an adhesive member which is attached on any one or either side of upper and lower portions of the magnetic sheet, in which gaps between the plurality of fine pieces are insulated in whole or in part. Here, the gaps between the plurality of fine pieces are insulated by an adhesive agent provided in the adhesive member which is permeated into the gaps.

Here, the plurality of fine pieces of the magnetic sheet preferably have an informal size of several tens μm to 3 mm or less. Further, the plurality of fine pieces may be an identical shape or different shapes, otherwise, may be a random shape.

Then, the magnetic sheet may have a thickness of 5 μm to 50 μm.

Figure 2:
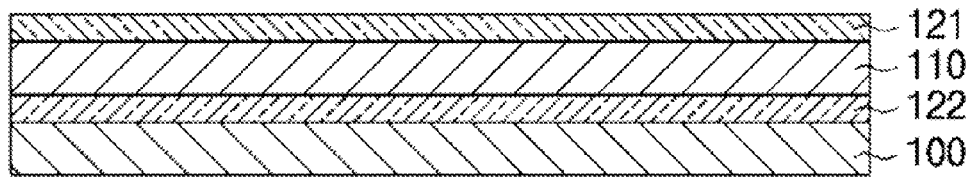
FIG. 2 is a schematic cross-sectional view of a first modification of the composite sheet according to the first embodiment of the present invention.

Referring to FIG. 2, a composite sheet according to according to a first modification of the first embodiment of the present invention, includes: a second insulation member 110 which facilitates a horizontal direction transfer of heat conducted but suppresses a vertical direction transfer thereof; a first double-sided tape 121 which is adhered on top of the second heat insulation member 110; a second double-sided tape 122 which is adhered on a lower portion of the second heat insulation member 110; and a first heat insulation member 100 which is adhered on a lower portion of the second double-sided tape 122 and which has a plurality of fine pores to form air pockets for thermal insulation.

The first double-sided tape 121 may be formed of, for example, a PET (Polyethylene Terephthalate) film on one side of which an adhesive layer is formed. The thickness of the first double-sided tape 121 is preferably thicker than the thickness of the second double-sided tape 122. That is, the first double-sided tape 121 should have a certain thickness in order to protect the second heat insulation member 110, but the second double-sided tape 122 may have a thickness meeting only a function for adhering the second heat insulation member 110 and the first heat insulation member 100. As a result, the thickness of the second double-sided tape 122 is thinner than the thickness of the first double-sided tape 121.

In this case, the first double-sided tape 121 may be formed to have a thickness of 10 μm to 30 μm, and the second double-sided tape 122 may be formed to have a thickness of 1 μm to 9 μm.

The second heat insulation member 110 may be formed of a thin plate ribbon made of an amorphous alloy or nanocrystalline alloy. The amorphous alloy may employ a Fe-based amorphous alloy or Co-based amorphous alloy; when considering the material cost, it is preferable to use the Fe-based amorphous alloy.

According to the present invention, a Fe—Si—B alloy, as needed, a Fe—Si—B—Co alloy may be used as the Fe-based amorphous alloy, and a Co—Fe—Ni—Si—B or Co—Fe—Cr—Si—B alloy may be used as the Co-based amorphous alloy.

The second heat insulation member 110 has a thermal conductivity of 3-4 W/m·K in the horizontal direction, and a thermal conductivity of 0.4 W/m·K in the vertical direction. Thus, since heat radiation is excellent due to diffusion of heat and heat transfer is suppressed in the vertical direction, good thermal insulation efficiency may be obtained.

For example, Fe—Si—B alloys may be used as Fe-based magnetic alloys. In the case of the Fe—Si—B alloy, it is preferable that Fe should be in the range of 70-90 atomic %, and the sum of Si and B should be in the range of 10-30 atomic %. The higher the content of a metal including Fe, the higher a saturation magnetic flux density becomes, but if the content of Fe is excessive, it is difficult to form an amorphous state. Thus, in the present invention, it is preferable that the content of Fe should be in the range of 70-90 atomic %. In addition, an amorphous state forming ability of the alloy is the most excellent when the sum of Si and B is in the range of 10-30 atomic %. In order to prevent corrosion, a corrosion-resistant element such as Cr or Co may be also added to the basic composition within 20 atomic %, and a small amount of other metal elements necessary to impart different properties may be included in the basic composition.

For example, the Fe—Si—B alloy whose crystallization temperature is 508° C. and whose Curie temperature (Tc) is 399° C. can be used in the present invention. However, the crystallization temperature may be varied depending on the content of Si and B, or the other metal elements and the content thereof to be added in addition to a ternary alloy composition. According to the present invention, a Fe—Si—B—Co alloy may be used as the Fe-based amorphous alloy.

Further, a Fe—Si—B—Cu—Nb alloy can be used as a Fe-based nanocrystalline magnetic alloy that is used in the second heat insulation member 110, and in this case, it is preferable that the content of Fe is 73-80 at %, the content of the sum of Si and B is 15-26 at %, and the content of the sum of Cu and Nb is 1-5 at %. An amorphous alloy that is obtained by producing such a composition range in the form of a ribbon may be easily precipitated into nanocrystalline grains by a thermal treatment to be described later.

Figure 3A:
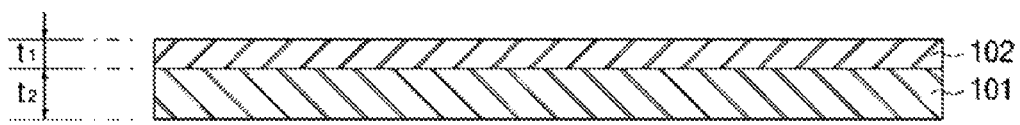
FIGS. 3A and 3B are conceptual cross-sectional views illustrating a porous thin film employed as a first heat insulation member of the composite sheet according to the first embodiment of the present invention.
Figure 3B:

FIGS. 3A and 3B are conceptual cross-sectional views for illustrating a porous thin film employed as the first heat insulation member of the composite sheet according to the first embodiment of the present invention.

The first heat insulation member of the composite sheet according to the first embodiment of the present invention may be applied as a porous thin film having a plurality of fine pores, in which the porous thin film may include one of nanofiber webs 102 and 103 which are formed by integrating nanofibers to thus have a microporous structure, a nonwoven fabric 101, and a laminate structure of the nanofiber webs 102 and 103 and the nonwoven fabric 101.

As shown in FIGS. 3A and 3B, the laminate structure of the nanofiber webs 102 and 103 and the nonwoven fabric 101 may be implemented into the laminated structure of the nanofiber web 102 and the nonwoven fabric 101 (FIG. 3A), or the laminated structure of the nanofiber web 102/the nonwoven fabric 101/the nanofiber web 103 (FIG. 3B). Here, the thickness (t1) of the nanofiber web 102 is preferably thinner than the thickness (t2) of the nonwoven fabric 101.

In this way, when the heat insulation member is implemented in a laminate structure of the nanofiber web 102 and nonwoven fabric 101, and since the nonwoven fabric 101 is less expensive than the nanofiber web 102 and the former has the higher strength than the latter, the manufacturing cost of the composite sheet may be reduced and the strength thereof may be improved simultaneously. In addition, the nonwoven fabric 101 has also a large number of pores, and thus has the ability to block the heat, to thus play a role of the heat insulation member.

Here, the nanofiber web 102 and the nonwoven fabric 101 may be fused due to the thermocompression. In this case, it is preferable that the nanofiber web 102 is melted to be fused on the nonwoven fabric 101 due to the heat applied during thermocompression, by designing the melting point of the nanofiber web 102 to be less than the melting point of the nonwoven fabric 101. For example, in the case that the polymer material for forming the nanofiber web 102 employs PVdF, the melting point of PVdF is 155° C., and thus the nonwoven fabric 101 employs one of polyester-based, nylon-based, and cellulose-based nonwoven fabrics having a melting point higher than 155° C.

Thus, during thermocompression, a region of the nanofiber web 102 adjacent to the nonwoven fabric 101 is melted and fused with the nonwoven fabric 101. Here, the pore size of the nonwoven fabric 101 is much larger than the pore size of the nanofiber web, and a portion of the melted nanofiber web 102 is infiltrated into the pores of the nonwoven fabric 101. That is, based on the boundary surfaces of the nonwoven fabric 101 and the nanofiber web 102 before thermocompression, the melted nanofiber web 2141 is spread and distributed in the direction of the nanofiber web 102 and in the direction of the nonwoven fabric 101 on the boundary surfaces after the thermocompression. When controlling the level of the amount of the melted nanofiber web 102 based on these technical features, the nanofiber web 102 is melted into the pores of the nonwoven fabric 101 and the nanofiber web 102 permeated into the pores the nonwoven fabric 101 performs a locking role to thereby improve the adhesion of the nanofiber web 102 and the nonwoven fabric 101.

According to the embodiment of the present invention, a polymer material forming the nanofiber web can employ a polymer material such as a mixture of PVdF and PAN at a ratio of 5 to 5. Here, the electrospun nanofiber is formed of a structure having a core made of PAN, and a cover portion that surrounds an outer peripheral surface of the core and made of PVdF. The nanofibers of this structure are laminated to form the nanofiber web 102. When the nanofiber web 102 that is formed by laminating the nanofibers having a structure of the core and the cover portion, is thermally compressed with the nonwoven fabric 101, PVdF of the cover portion is melted and penetrated into and fused with the nonwoven fabric 101.

Figure 4A:
FIGS. 4A and 4B are cross-sectional views of a second modification of the composite sheet according to the first embodiment of the present invention.
Figure 4B:

FIGS. 4A and 4B are cross-sectional views of a second modification of the composite sheet according to the first embodiment of the present invention.

As shown in FIG. 4A, the composite sheet according to the second modification of the first embodiment of the present invention, includes: a first heat insulation member 100; a second heat insulation member 110 laminated on one surface of the first heat insulation member 100; and an adhesive layer 120 laminated on the second heat insulation member 110.

In addition, as shown in FIG. 4B, the composite sheet according to the second modification of the first embodiment of the present invention, includes: a first heat insulation member 100; a second heat insulation member 110 laminated on one surface of the first heat insulation member 100; and an adhesive layer 120 laminated on the other surface of the first heat insulation member 100.

The first heat insulation member 100 is formed of a porous thin film that may block heat transfer by pores. The first heat insulation member 100 employs, for example, a nanofiber web type having a plurality of pores according to an electrospinning method, a nonwoven fabric having a plurality of pores, PES (polyether sulfone), and the like. Any material having a plurality of pores and allowing vertical insulation may be applied as the first heat insulation member 100. Here, the pore size of the first heat insulation member 100 is preferably approximately from several tens nm to 5 µm at maximum.

When the first heat insulation member 100 is formed of the nanofiber web type, a polymer material that may be electrospun and may have excellent heat resistance is mixed with a solvent at a predetermined ratio to thus create a spinning solution, and then the spinning solution is electrospun to thereby form nanofibers. Then, the nanofibers are accumulated to form the first heat insulation member 100 having a plurality of pores in a nanofiber web type.

As the diameters of the nanofibers are smaller, the specific surface areas of the nanofibers are increased, and an air trap ability of the nanofiber web having a plurality of fine pores is increased, thereby improving the heat insulation performance. Thus, it is preferable that the diameters of the nanofibers should be in the range of 0.3 µm-1.5 µm. The first heat insulation member 100 may be designed to have a thickness of 10 µm-25 µm. Further, porosity of the pores formed in the first heat insulation member 109 is preferably in the range of 50-80%.

Here, the spinning method that is applied to some embodiments of the present invention, may employ any one selected from general electrospinning, air-electrospinning (AES), electrospray, electrobrown spinning, centrifugal electrospinning, and flash-electrospinning.

A polymeric material used to make the first heat insulation member 100 may be made of one of, for example, oligomer polyurethane, and polymer polyurethane, PS (polystylene), PVA (polyvinylalchol), PMMA (polymethyl methacrylate), PLA (polylactic acid), PEO (polyethyleneoxide), PVAc (polyvinylacetate), PAA (polyacrylic acid), PCL (polycaprolactone), PAN (polyacrylonitrile), PVP (polyvinylpyrrolidone), PVC (polyvinylchloride), nylon, PC (polycarbonate), PEI (polyetherimide), PVdF (polyvinylidene fluoride), PEI (polyetherimide), PES (polyesthersulphone) or a mixture thereof.

Here, the thermal conductivity of the polymer is preferably set to less than 0.1 W/m·K.

Since it is known that the polyurethane (PU) of the polymer materials has thermal conductivity of 0.016~0.040 W/m·K and the polystylene (PS) have thermal conductivity of 0.033~0.040 W/m·K, the nanofiber webs that are obtained by spinning the polyurethane (PU) and the polystylene (PS) have also low thermal conductivity.

The solvent may employ at least one selected from the group consisting of DMA (dimethyl acetamide), DMF (N, N-dimethylformamide), NMP (N-methyl-2-pyrrolidinone), DMSO (dimethyl sulfoxide), THF (tetra-hydrofuran), DMAc (di-methylacetamide), EC (ethylene carbonate), DEC (diethyl carbonate), DMC (dimethyl carbonate), EMC (ethyl methyl carbonate), PC (propylene carbonate), water, acetic acid, and acetone.

The first heat insulation member 100 is prepared by the electrospinning method, and thus thickness of the first heat insulation member 100 is determined according to a spinning dose of a spinning solution. Accordingly, it is easy to have the first heat insulation member 100 made into a desired thickness.

As described above, since the first heat insulation member 100 is formed into a nanofiber web shape in which the nanofibers are accumulated by a spinning method, the first heat insulation member 100 may be made of a type having a plurality of pores without a separate process. It is also possible to adjust size of the pores according to a spinning dose of a spinning solution. Thus, since the multiple pores may be finely made, heat blocking performance is excellent, to accordingly improve heat insulation performance.

Here, the adhesive layer 120 is formed of an adhesive material having thermal conductivity so that heat generated by a heat generating component may be passed quickly to the first heat insulation member 100 or the second heat insulation member 110. For example, the adhesive layer may be formed by using a conventional thermally conductive adhesive tape or thermally conductive adhesive sheet, and may be formed in a non-pore nanofiber web type by using an electrospinning method.

When the adhesive layer 120 is formed in a non-pore nanofiber web type, a thermally and electrically conductive adhesive material is formed by the following processes of: mixing any one of a thermally conductive metal such as Ni, Cu, or Ag having excellent thermal conductivity, carbon black, carbon nanotubes, graphene, and conductive polymers (PDOT) with an adhesive and a solvent, to thus prepare an adhesive material with a viscosity suitable for electrospinning; electrospinning the adhesive material to thus form nanofibers; and accumulating the nanofibers to then be formed into a non-pore nanofiber web type.

That is, the adhesive layer 120 may be formed by using the electrospinning method in the same manner as the method of forming the first heat insulation member 100, and thickness of the adhesive layer 120 is determined in accordance with the spinning dose of the adhesive material, to thus freely make the thickness of the adhesive layer 120.

Figure 5:
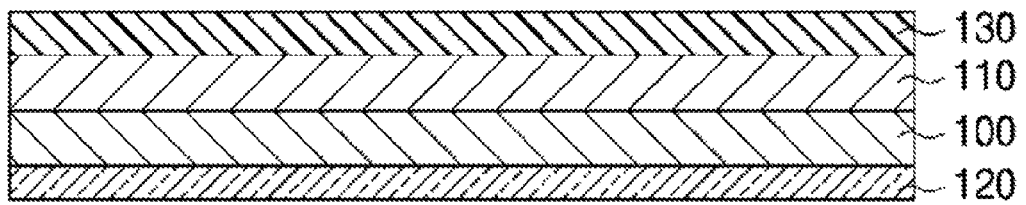
FIG. 5 is a cross-sectional view of a third modification of the composite sheet according to the first embodiment of the present invention.

FIG. 5 is a cross-sectional view of a third modification of the composite sheet according to the first embodiment of the present invention.

Referring to FIG. 5, the composite sheet according to the third modification of the first embodiment of the present invention, includes: a second heat insulation member 110; a first heat insulation member 100 laminated on one surface of the second heat insulation member 110; an electrically conductive adhesive layer 130 laminated on the other surface of the second heat insulation member 110 to thus absorb electromagnetic waves; and an adhesive layer 120 laminated on one surface of the first heat insulation member 100.

The electrically conductive adhesive layer 130 may be formed by an electrospinning apparatus, in the same manner as that for forming the first heat insulation member 100, and an electrically conductive adhesive film may be adhered on one surface of the second heat insulation member 110.

When the electrically conductive adhesive layer 130 is formed by using the electrospinning apparatus, a polymer material that may be electrospun is mixed with an electrically conductive adhesive material and a solvent at a predetermined ratio to thus create a spinning solution, and then the spinning solution is electrospun to thereby form nanofibers. Then, the nanofibers are accumulated to form the electrically conductive adhesive layer 130 in a non-pore type nanofiber web type.

Thus, the composite sheet according to the third modification of the first embodiment is provided with the electrically conductive adhesive layer 130 thereby absorbing the electromagnetic waves, and thus it is possible to further improve electromagnetic wave shielding efficiency.

Figure 6A:
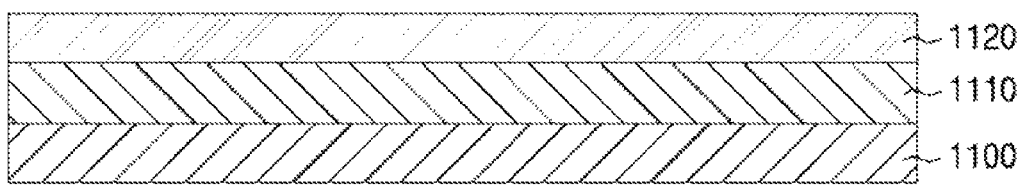
FIGS. 6A to 6C are schematic cross-sectional views of a composite sheet according to a second embodiment of the present invention.
Figure 6B:
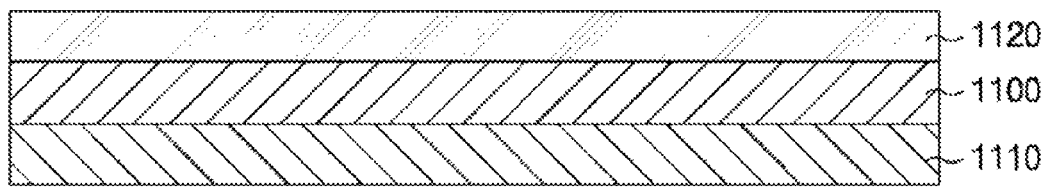
Figure 6C:
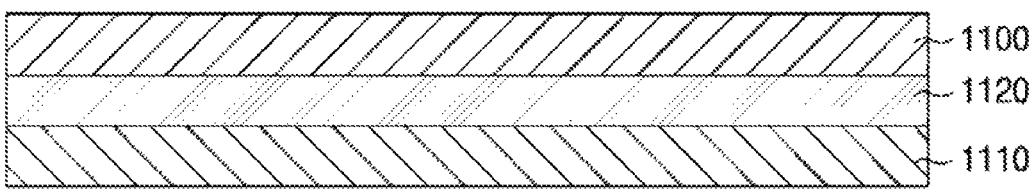

FIGS. 6A to 6C are schematic cross-sectional views of a composite sheet according to a second embodiment of the present invention.

The composite sheet according to the second embodiment of the present invention, is configured to implement a heat transfer suppression function and a heat radiation function with a single sheet, by laminating: a first heat insulation member having a plurality of fine pores to form air pockets for thermal insulation; a heat spreader which disperses heat; and a second heat insulation member which facilitates a horizontal direction transfer of heat conducted but suppresses a vertical direction transfer thereof.

That is, the composite sheet according to the second embodiment of the present invention, is configured to implement a laminate structure including: the first heat insulation member 1100; the heat spreader 1110; and the second heat insulation member 1120, into a single sheet, thereby providing an advantage that can perform a function of suppressing the heat transfer and a function of dispersing and radiating heat.

The composite sheet according to the second embodiment of the present invention is configured into a laminated sheet by arranging the first insulation member 1100, the heat spreader 1110, and the second heat insulation member 1120, in a free order, depending on the location where the sheet is attached, and the purpose for which the sheet is used.

That is, referring to FIG. 6A, the composite sheet according to the second embodiment of the present invention, is configured to include the first heat insulation member 1100; the heat spreader 1110 which is laminated on the first heat insulation member 1100; and the second heat insulation member 1120 which is laminated on the heat spreader 1110. That is, the composite sheet is implemented by laminating the first heat insulation member 1100, the heat spreader 1110, and the second heat insulation member 1120, in the order of the first heat insulation member 1100, the heat spreader 1110, and the second heat insulation member 1120.

In addition, the composite sheet of FIG. 6B is implemented by laminating the heat spreader 1110, the first insulation member 1100, and the second heat insulation member 1120, in the order of the heat spreader 1110, the first insulation member 1100, and the second heat insulation member 1120.

In addition, as shown in FIG. 6C, the composite sheet is implemented by laminating the heat spreader 1110, the second heat insulation member 1120, and the first heat insulation member 1100 in the order of the heat spreader 1110, the second heat insulation member 1120, and the first heat insulation member 1100.

Therefore, the composite sheet according to the second embodiment of the present invention performs a heat insulating function by blocking the heat transfer in the first heat insulation member 1100, performs a heat radiating function by dispersing the heat in the heat spreader 1110, and performs a heat transfer suppression function in the second heat insulation member 1120, to thus provide an advantage of performing both heat transfer suppression and heat radiation with a single sheet.

The heat spreader 1110 disperses heat transmitted from the outside. In other words, the heat spreader 1110 may block heat generated by a heat generating component from being concentrated in one place to thereby perform a function of dispersing the heat.

In addition, the heat spreader 1110 may be a metal thin plate whose thermal conductivity is 200 W/m·K or higher in which the metal thin plate is preferably made of Cu or Al.

Figure 7A:
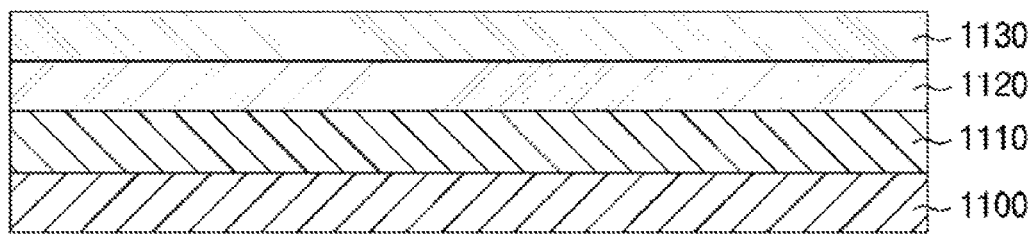
FIGS. 7A and 7B are conceptual cross-sectional views respectively illustrating states that an adhesive layer is applied to the composite sheet according to the second embodiment of the present invention.
Figure 7B:
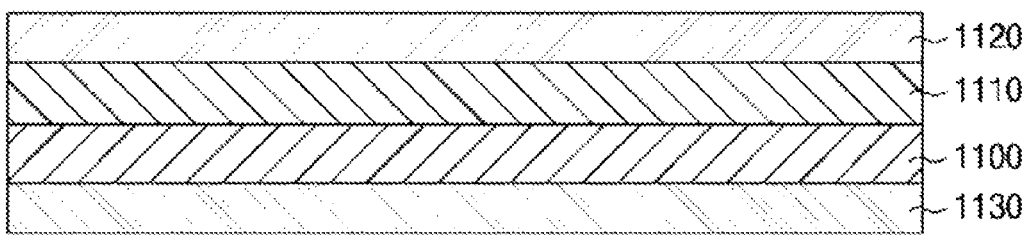

Referring to FIGS. 7A and 7B, the composite sheet according to the second embodiment of the present invention, includes an adhesive layer 1130 which can transfer heat generated from a heat generating component to the first heat insulation member 1100 or the heat spreader 1110 rapidly, in which the adhesive layer 1130 is formed of an adhesive material with high thermal conductivity.

The adhesive layer 1130 may be formed on the second heat insulation member 1120 as shown in FIG. 7A, or may be also formed on the first heat insulation member 1100, as shown in FIG. 7B. In addition, the adhesive layer 1130 may be formed on the heat spreader 1110, in the structure of FIGS. 6B and 6C.

In addition, in the laminated structure of the composite sheet, the adhesive layer 1130 may be sandwiched between the first heat insulation member 1100 and the heat spreader 1110, and between the heat spreader 1110 and the second heat insulation member 1120, respectively.

Figure 8A:
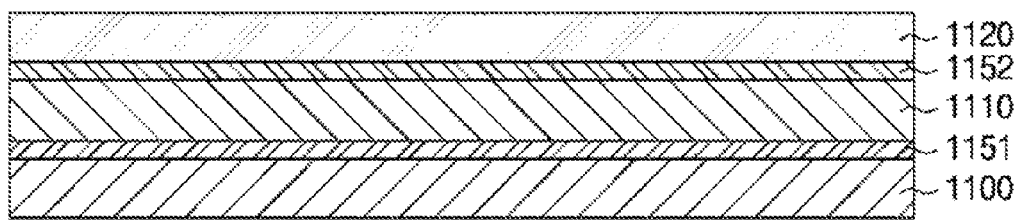
FIGS. 8A and 8B are conceptual cross-sectional views illustrating a state that double-sided tapes are applied to the composite sheet according to the second embodiment of the present invention, respectively.
Figure 8B:
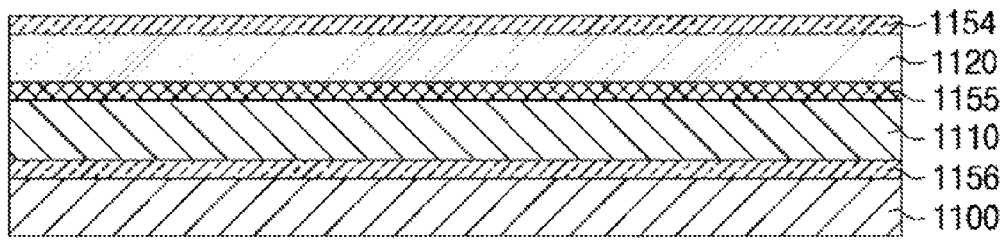

FIGS. 8A through 8C are conceptual cross-sectional views showing a state where double-sided tapes are applied to the composite sheet according to the second embodiment of the present invention, respectively.

As shown in FIG. 8A, double-sided tapes 1151 and 1152 may be interposed between the first heat insulation member 1100 and the heat spreader 1110 and between the heat spreader 1110 and the second heat insulation member 1120, respectively, in the structure that the first heat insulation member 1100, the heat spreader 1110, and the second heat insulation member 1120 are laminated in turn. In addition, a double-sided tape 1153 may be adhered on one of the first heat insulation member 1100, the heat spreader 1110, and the second heat insulation member 1120, which is exposed on an upper portion or lower portion of the composite sheet laminated as shown in FIGS. 6A to 6C.

In addition, as shown in FIG. 8B, the composite sheet is configured to include a second heat insulation member 1120, a first double-sided tape 1154 which is adhered on top of the second heat insulation member 1120, a second double-sided tape 1155 which is adhered on the bottom of the second heat insulation member 1120, a heat spreader 1110 which is adhered on the bottom of the second double-sided tape 1155, to thus disperse heat transfer, a third double-sided tape 1156 which is adhered on the bottom of the heat spreader 1110, and a first insulation member 1100 which is adhered on the bottom of the third double-sided tape 1156, in a laminated structure.

Here, the double-sided tapes 1151, 1152, 1153, 1154, 1155, and 1156 employ, for example, a PET (Polyethylene Terephthalate) film on both sides of which adhesive layers are formed.

Figure 9:
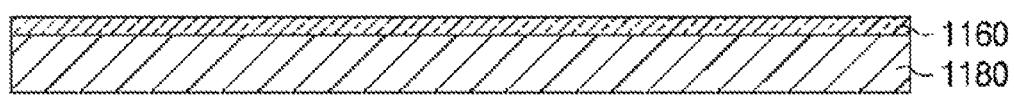
FIG. 9 is a cross-sectional view of a state in which an electrically conductive adhesive layer is formed on the composite sheet according to the second embodiment of the present invention.

Referring to FIG. 9, the composite sheet according to the second embodiment further includes an electrically conductive adhesive layer 1160 to absorb electromagnetic waves in addition to a laminated structure 1180 of a first heat insulation member, a heat spreader, and a second heat insulation member.

Figure 10:
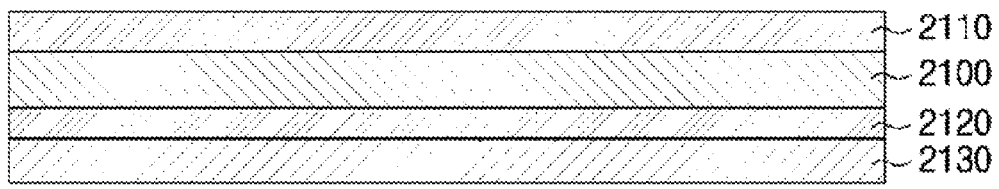
FIG. 10 is a conceptual cross-sectional view of a composite sheet according to a third embodiment of the present invention.

FIG. 10 is a conceptual cross-sectional view of a composite sheet according to a third embodiment of the present invention.

Referring to FIG. 10, the composite sheet according to the third embodiment of the present invention, is configured to include a magnetic sheet 2100 which secondarily diffuses heat conducted and suppresses the heat transfer in the vertical direction; a first double-sided tape which is adhered on top of the magnetic sheet 2100; a second double-sided tape 2120 which is attached on the bottom of the magnetic sheet 2100; and a heat spreader 2130 which is adhered on the bottom of the second double-sided tape 2120 to thus disperse and radiate the heat.

Here, the first and second double-sided tapes 2110 and 2120 applied to the composite sheet according to the third embodiment of the present invention are adhesive members.

The structure of FIG. 10 is an example of the composite sheet. The composite sheet according to the third embodiment of the present invention is also implemented to include: a heat spreader 2130 which disperses heat and radiates the heat; and a magnetic sheet 2100 which is laminated on the heat spreader 2130 and is configured to include a plurality of fine pieces which are separated in a fine size and disposed adjacent, and an adhesive member which is attached on any one or either side of upper and lower portions of the magnetic sheet, in which gaps between the plurality of fine pieces are insulated in whole or in part, to thus secondarily diffuse heat conducted from the heat spreader 2130 and suppress a vertical direction transfer of the heat.

Therefore, the composite sheet according to the third embodiment of the present invention performs a heat radiation function by dispersing the heat transfer in the heat spreader 2130, and performs a function of secondarily diffusing heat conducted from the heat spreader 2130 and suppressing a vertical direction transfer of the heat in the magnetic sheet 2100, to thus provide an advantage of implementing a multi-functional sheet which can perform heat radiation and heat transfer suppression with a single sheet.

Thus, the composite sheet according to the third embodiment of the present invention may be implemented into an ultra-thin sheet with a thickness of several tens of μm.

Figure 11:
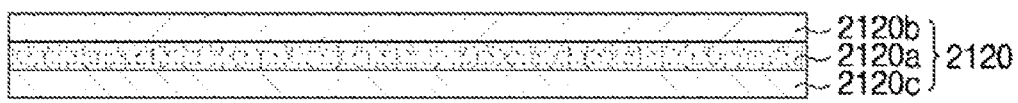
FIG. 11 is a conceptual cross-sectional view for explaining the structure of a double-sided tape applied to the composite sheet according to the third embodiment of the present invention.
Figure 12:
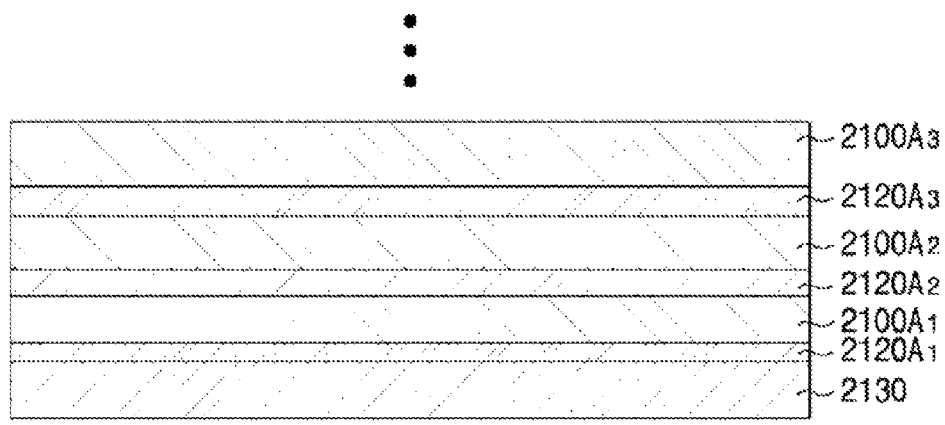
FIG. 12 is a conceptual sectional view for illustrating a laminated structure of the composite sheet according to the third embodiment of the present invention.

FIG. 11 is a conceptual cross-sectional view for explaining structure of a double-sided tape applied to the composite sheet according to the third embodiment of the present invention, and FIG. 12 is a conceptual cross-sectional view for explaining a laminated structure of the composite sheet according to the third embodiment of the present invention.

As shown in FIG. 11, a second double-sided tape 2120 is configured to include a substrate 2120a on both sides of which adhesive layers 2120b and 2120c are formed in which the substrate 2120a is made of a fluorine-based resin film such as a PET (Polyethylene Terephthalate) film.

The adhesive layers 2120b and 2120c may be, for example, formed of an acrylic adhesive, but it is of course also possible to use other types of adhesives as the adhesive layers 2120b and 2120c. Then, release films are adhered to the adhesive layers 2120b and 2120c, in the manufacture of double-sided tapes and are formed integrally. The release films are peeled off and removed when attaching a composite sheet in accordance with the present invention on an electronic device.

Referring to FIG. 12, the composite sheet according to the third embodiment of the present invention may include a plurality of magnetic sheets. In this case, the composite sheet is implemented by repeatedly laminating double-sided tapes $2120A_1$, $2120A_2$, and $2120A_3$ adhered on the bottom of the magnetic sheets $2100A_1$, $2100A_2$, and $2100A_3$ on the heat spreader 2130. In other words, a first set made of the magnetic sheet $2100A_1$ and the double-sided tape $2120A_1$ is laminated on the heat spreader 2130, a second set made of the magnetic sheet $2100A_2$ and the double-sided tape $2120A_2$ is laminated on the magnetic sheet $2100A_1$ of the first set, and a third set made of the magnetic sheet $2100A_3$ and the double-sided tape $2120A_3$ is laminated on the magnetic sheet $2100A_2$ of the second set. As described above, when the composite sheet includes a plurality of the magnetic sheets $2100A_1$, $2100A_2$, and $2100A_3$, a heat transfer suppression capability is improved, and an excellent electromagnetic wave shielding function is also possessed.

Figure 13:
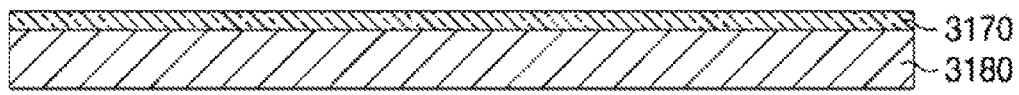
FIG. 13 is a cross-sectional view showing a state in which a colored cover layer is formed on the composite sheet according to the present invention.

FIG. 13 is a cross-sectional view showing a state in which a color cover layer is formed on the composite sheet according to an embodiment of the present invention.

Referring to FIG. 13, a color cover layer 3170 having a different color is further formed in addition to a laminated structure 3180 of a composite sheet according to the above-described first to third embodiments.

When the composite sheet according to the first to third embodiments is used for a portion to be exposed to the outside, the color cover layer 3170 having a different color is provided for a portion to be exposed to the outside of the composite sheet to thus beautify designs.

The color cover layer 3170 may be formed by coating a coating material of a color on the laminated structure 3180 of a composite sheet according to the above-described first to third embodiments. Otherwise, the color cover layer 3170 may be implemented with a single-sided adhesive tape on one surface of which color is formed.

In this case, the color cover layer 3170 may be laminated on the magnetic sheet of the laminated structure 3180 of the composite sheet.

For example, when the composite sheet according to the first to third embodiments of the present invention is attached to an inner surface of a cover of a mobile terminal, removing the cover from the body allows the inner surface of the cover to be exposed to the outside. Thus, when the color of the cover is white, the color cover layer 3170 is formed as white, and when the color of the cover is black, the color cover layer 3170 is formed as black. The color cover layer 3170 is formed in the same color as the cover.

In Table 1, after having prepared mobile terminals, respectively having rear covers on which a composite sheet according to a third embodiment of the present invention was mounted, a graphite sheet according to a Comparative Example 2 was mounted, and no sheet was mounted, a variation in temperature of the rear covers was measured by using a thermal imaging camera (FLIR Inc. Model T420), while sequentially operating a video in the mobile terminals. Here, the composite sheet according to the third embodiment of the present invention had a thickness of 61 μm having a structure as shown in FIG. 10 which included a magnetic sheet and a Cu thin sheet which is a heat spreader; and the graphite sheet on which a double-sided tape having a thickness of 65 μm was laminated according to the Comparative Example 2, were mounted on the rear covers of the mobile terminals, respectively. In addition, no sheet was mounted on the rear cover of the mobile terminal.

Referring to Table 1, the composite sheet according to the third embodiment of the present invention made of the magnetic sheet and the Cu thin sheet has a heat transfer smaller than the Comparative Example 1, and exhibits substantially the same temperature change as the graphite sheet according to the Comparative Example 2. Thus, it can be seen that the composite sheet according to the third embodiment of the present invention has excellent heat insulating efficiency.

TABLE 1

| Sheet | 20 minutes | 30 minutes | 40 minutes |
| --- | --- | --- | --- |
| Comparative Example 1 (No sheet) | 41.2° C. | 41.6° C. | 42.4° C. |
| Comparative Example 2 (Graphite sheet) | 38.1° C. | 38.8° C. | 40.1° C. |
| Third embodiment thin (Magnetic sheet + Cu thin sheet) | 39.1° C. | 39.8° C. | 40.1° C. |

Figure 14A:
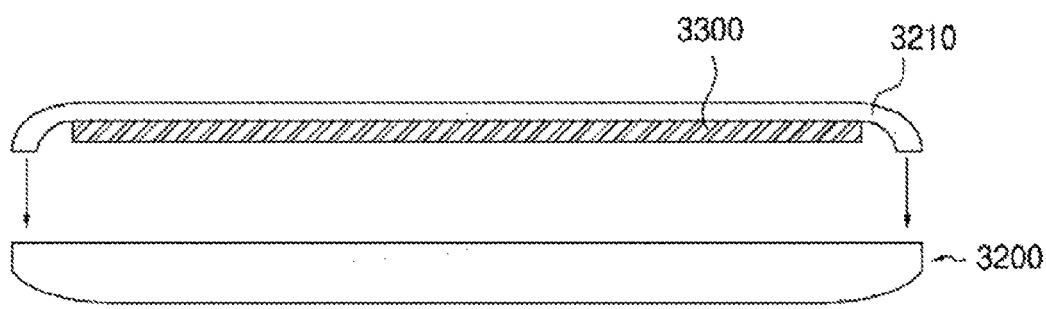
FIGS. 14A and 14B are conceptual cross-sectional views illustrating a mobile terminal according to the present invention in which the composite sheet is provided thereon.
Figure 14B:
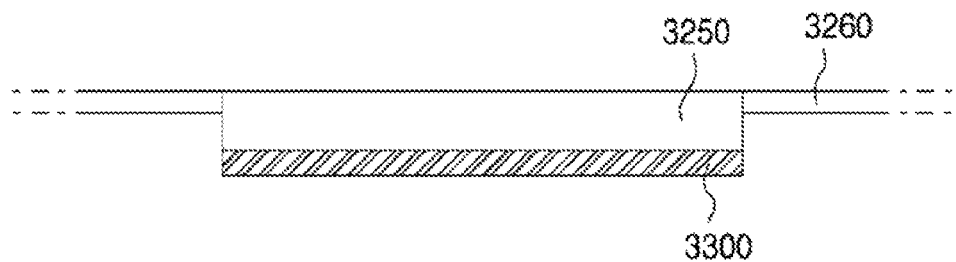

FIGS. 14A and 14B are conceptual cross-sectional views illustrating a mobile terminal on which a composite sheet according to the present invention is provided.

The composite sheets according to the first to third embodiments of the present invention may be mounted on the mobile terminals, and may have a heat transfer suppression function. When the composite sheets according to the second and third embodiments are mounted on the mobile terminals, the heat generated from the hot spot of the mobile terminals may be dispersed in the heat spreader.

Therefore, the composite sheet according to the first to third embodiments of the present invention may minimize the thermal effect applied to the internal components in the mobile terminal, and block the heat generated by the hot spot from leaking out, to thereby minimize the heat transferred to the user who grips the mobile terminal.

In an embodiment of the present invention, as shown in FIG. 14A, a composite sheet 3300 may be provided on an inside of a rear cover of a mobile terminal 3210. Here, the mobile terminal includes a terminal main body 3200 that performs a mobile terminal function; and a rear cover 3210 that is detachably mounted on a rear surface of the terminal main body 3200. There are some areas on the rear surface of the terminal main body 3200, in which a battery, a memory chip, and the like may be mounted, and the rear cover 3210 is detachably mounted on the rear surface of the terminal main body 3200 for easy replacement of the battery, the memory chip, and the like, and the good appearance of the mobile terminal. Here, the rear cover 3210 may be referred to as a battery cover.

In an embodiment of the present invention, as shown in FIG. 14B, a composite sheet 3300 may be adhered and provided on a rear surface of a display unit 3250, to thus suppress a transfer of heat conducted through the display unit 3250. It is noted that the display unit 3250 is exposed from an outer case 3260 in the terminal main body of the mobile terminal, to thus make it possible for heat and electromagnetic waves to be applied to a user through the display unit 3250.

That is, the mobile terminal includes: a terminal main body portable that performs a mobile terminal function; a display unit 3250 that is exposed to the terminal main body; and a composite sheet 3300 adhered on a rear surface of the display unit 3250. Here, the composite sheet 3300 is integrated into the terminal main body, and may be attached to a reverse side to an exposed surface of the display unit 3250 that is exposed to the terminal main body.

As described above, the composite sheet 3300 is adhered on the rear cover 3210 of the mobile terminal or the rear surface of the display unit 3250, in a manner that a magnetic sheet or a heat spreader is close to the rear cover 3210 of the mobile terminal or the rear surface of the display unit 3250. That is, the magnetic sheet or the heat spreader may be adhered in two modes so as to be close to the rear cover 3210 of the mobile terminal or the rear surface of the display unit 3250.

As described above, the present invention has been described with respect to particularly preferred embodiments. However, the present invention is not limited to the above embodiments, and it is possible for one who has an ordinary skill in the art to make various modifications and variations, without departing off the spirit of the present invention. Thus, the protective scope of the present invention is not defined within the detailed description thereof but is defined by the claims to be described later and the technical spirit of the present invention.

INDUSTRIAL APPLICABILITY

The present invention may be applied to a composite sheet which can maximize a heat transfer suppression efficiency by performing a heat transfer suppression function and a radiation function with a single sheet, and which can be ultra-thinned.

The invention claimed is:

1. A composite sheet comprising:
a first heat insulation member having a plurality of fine pores to form air pockets for thermal insulation;
a second heat insulation member which is laminated on the first heat insulation member, and which facilitates a horizontal direction transfer of heat conducted but suppresses a vertical direction transfer thereof; and
a heat spreader which is laminated between the first insulation member and the second heat insulation member to thus disperse heat,
wherein the first heat insulation member is a nanofiber web or a laminated structure of a nanofiber web and a nonwoven fabric, and the nanofiber web is formed of accumulated nanofibers made by an electrospinning process.

2. The composite sheet of claim 1, wherein the second insulation member comprises a magnetic sheet having a ratio of a horizontal direction thermal conductivity with respect to a vertical direction thermal conductivity of 10:1 or more.

3. The composite sheet of claim 2, wherein the second insulation member comprises a magnetic sheet having a specific resistivity of at least 100.

4. The composite sheet of claim 2, wherein the magnetic sheet is a Fe-based amorphous alloy or a Co-based amorphous alloy.

5. The composite sheet of claim 4, wherein the Fe-based amorphous alloy is a Fe—Si—B alloy or Fe—Si—B—Cu—Nb alloy.

6. The composite sheet of claim 4, wherein the magnetic sheet is configured to include a plurality of fine pieces which are separated in a fine size and disposed adjacent, and an adhesive member which is attached on any one or either side of upper and lower portions of the magnetic sheet, in which gaps between the plurality of fine pieces are insulated in whole or in part.

7. The composite sheet of claim 1, wherein the heat spreader is a metal thin plate of a thermal conductivity of 200 W/m·K or more.

8. The composite sheet of claim 7, wherein the metal thin plate is made of Cu or Al.

9. A composite sheet comprising:
a heat spreader which disperses heat and radiates the heat; and
a magnetic sheet which is laminated on the heat spreader and is configured to include a plurality of fine pieces which are separated in a fine size and disposed adjacent, and an adhesive member which is attached on any one or either side of upper and lower portions of the magnetic sheet, in which gaps between the plurality of fine pieces are insulated in whole or in part, to thus secondarily diffuse heat conducted from the heat spreader and suppress a vertical direction transfer of the heat.

10. The composite sheet of claim 9, wherein the magnetic sheet is formed of an amorphous alloy or a nanocrystalline alloy.

11. The composite sheet of claim 9, wherein the magnetic sheet has a ratio of a horizontal direction thermal conductivity with respect to a vertical direction thermal conductivity of 10:1.

12. The composite sheet of claim 9, wherein the magnetic sheet has a specific resistivity of at least 100.

13. The composite sheet of claim 9, wherein the heat spreader is a metal thin plate of a thermal conductivity of 200 W/m·K or more.

14. The composite sheet of claim 13, wherein the metal thin plate is made of Cu or Al.

15. The composite sheet of claim 9, wherein thickness of the magnetic sheet is 5 μm to 50 μm.

16. A mobile terminal comprising:
a terminal main body;
a removable rear cover on a rear surface of the terminal main body;
a display unit which is exposed to the terminal main body; and
a composite sheet adhered to an inner side of the rear cover or a rear surface of the display unit, wherein the composite sheet comprises:
a heat spreader which disperses heat and radiates the heat; and
a magnetic sheet which is laminated on the heat spreader and is configured to include a plurality of fine pieces which are separated in a fine size and disposed adjacent, and an adhesive member which is attached on any one or either side of upper and lower portions of the magnetic sheet, in which gaps between the plurality of fine pieces are insulated in whole or in part, to thus secondarily diffuse heat conducted from the heat spreader and suppress a vertical direction transfer of the heat.

17. The mobile terminal of claim 16, wherein the heat spreader is a Cu or a Al sheet, and the magnetic sheet is formed of an amorphous alloy or a nanocrystalline alloy.

* * * * *